United States Patent
Pan et al.

(10) Patent No.: US 9,595,477 B2
(45) Date of Patent: Mar. 14, 2017

(54) SEMICONDUCTOR DEVICE INCLUDING AN EPITAXY REGION

(75) Inventors: Te-Jen Pan, Hsinchu (TW); Yu-Hsien Lin, Hsin-Chu (TW); Hsiang-Ku Shen, Zhongli (TW); Wei-Han Fan, Hsin-Chu (TW); Yun Jing Lin, Hsinchu (TW); Yimin Huang, Hsinchu (TW); Tzu-Chung Wang, Shengang Township, Taichung County (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 581 days.

(21) Appl. No.: 13/010,028

(22) Filed: Jan. 20, 2011

(65) Prior Publication Data
US 2012/0187459 A1    Jul. 26, 2012

(51) Int. Cl.
| | |
|---|---|
| H01L 21/4763 | (2006.01) |
| H01L 21/8238 | (2006.01) |
| H01L 29/165 | (2006.01) |
| H01L 29/66 | (2006.01) |
| H01L 29/78 | (2006.01) |

(52) U.S. Cl.
CPC ............ *H01L 21/823807* (2013.01); *H01L 21/823814* (2013.01); *H01L 21/823828* (2013.01); *H01L 21/823864* (2013.01); *H01L 21/823871* (2013.01); *H01L 29/165* (2013.01); *H01L 29/6653* (2013.01); *H01L 29/6659* (2013.01); *H01L 29/66545* (2013.01); *H01L 29/66628* (2013.01); *H01L 29/66636* (2013.01); *H01L 29/7834* (2013.01); *H01L 29/7848* (2013.01)

(58) Field of Classification Search
CPC ...... H01L 21/823807; H01L 21/823814; H01L 21/823828; H01L 21/823864; H01L 21/823871; H01L 29/165; H01L 29/7848; H01L 29/66545; H01L 29/6659; H01L 29/66628; H01L 29/66636; H01L 29/7834; H01L 29/6653
USPC .......... 257/288, E21.158, E21.409, E29.242, 257/299, 595
See application file for complete search history.

(56) References Cited

U.S. PATENT DOCUMENTS

| | | | | |
|---|---|---|---|---|
| 6,040,223 | A * | 3/2000 | Liu | H01L 21/76895 257/E21.507 |
| 2002/0137293 | A1* | 9/2002 | Chen | H01L 29/41783 438/289 |
| 2004/0077136 | A1* | 4/2004 | Ma | H01L 29/802 438/200 |

(Continued)

*Primary Examiner* — Vongsavanh Sengdara
(74) *Attorney, Agent, or Firm* — Haynes and Boone, LLP

(57) ABSTRACT

A method is described which includes providing a substrate and forming a first spacer material layer abutting a gate structure on the substrate. A second spacer material layer is formed adjacent and abutting the gate structure and overlying the first spacer material layer. The first spacer material layer and the second spacer material layer are then etched concurrently to form first and second spacers, respectively. An epitaxy region is formed (e.g., grown) on the substrate which includes an interface with each of the first and second spacers. The second spacer may be subsequently removed and the first spacer remain on the device decreases the aspect ratio for an ILD gap fill. An example composition of the first spacer is SiCN.

13 Claims, 17 Drawing Sheets

(56) References Cited

U.S. PATENT DOCUMENTS

| | | | |
|---|---|---|---|
| 2004/0259303 A1* | 12/2004 | Lee | H01L 29/4966 438/232 |
| 2006/0166422 A1* | 7/2006 | Suenaga | H01L 21/82380 438/199 |
| 2007/0102776 A1* | 5/2007 | Pan | H01L 21/28088 257/411 |
| 2007/0128786 A1* | 6/2007 | Cheng | H01L 21/82380 438/199 |
| 2008/0081406 A1* | 4/2008 | Choo | H01L 21/82341 438/199 |
| 2008/0258233 A1* | 10/2008 | Hsiao | H01L 21/82380 257/382 |
| 2009/0027643 A1 | 1/2009 | Yeh et al. | |
| 2010/0062592 A1* | 3/2010 | Clark | H01L 21/28176 438/591 |
| 2010/0252810 A1* | 10/2010 | Fuller | H01L 21/32137 257/14 |
| 2012/0104470 A1* | 5/2012 | Ponoth | H01L 29/66545 257/288 |

* cited by examiner

SEMICONDUCTOR DEVICE INCLUDING AN EPITAXY REGION

BACKGROUND

The semiconductor industry has progressed into smaller technology node processes in pursuit of higher device density, higher performance, and lower costs. One process for improved device performance includes creating an epitaxy region for the source/drain for enhanced transistor device performance. The epitaxy region provides a strained region that enhances carrier mobility.

Issues may arise from the process of growing the epitaxy regions however. These issues include growth of unwanted epitaxial material on other regions of the device. For example, exposure of a sidewall of a gate stack may lead to undesirable epitaxial growth on the gate stack. This growth may be characterized as a "mushroom" on account of its shape.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over, on, or abutting a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Figure 1:
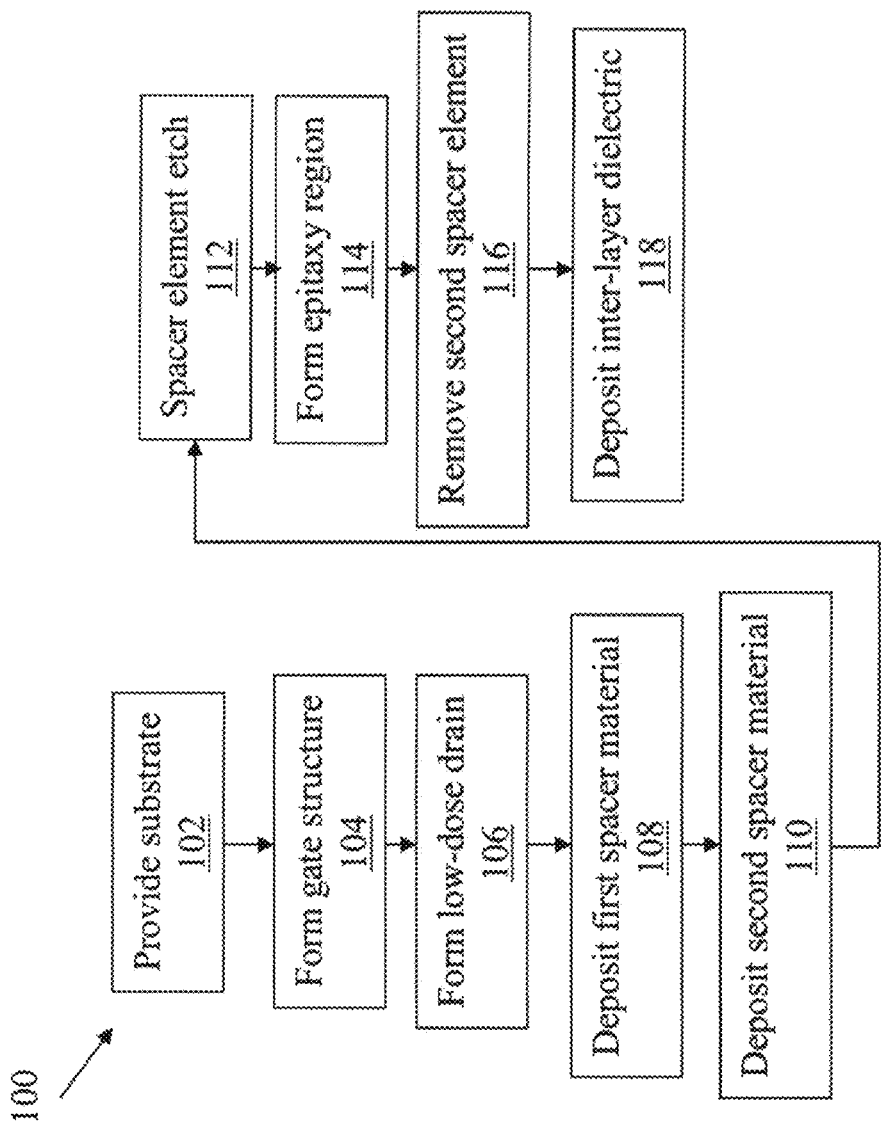
FIG. 1 is a flowchart illustrating an embodiment of a method according to one or more aspects of the present disclosure.
Figure 2:
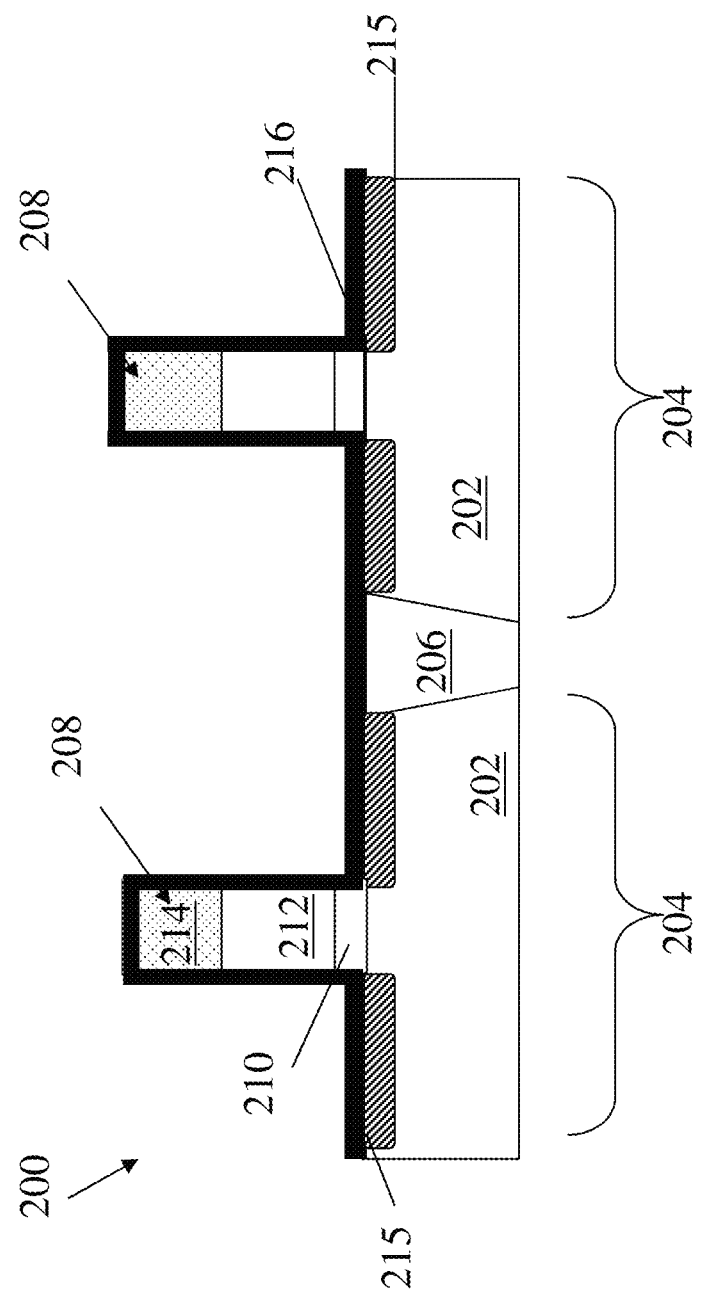
FIGS. 2-6 are cross-sectional views of an embodiment of a semiconductor device corresponding to steps of the method of FIG. 1.

Illustrated in FIG. 1 is a method 100 of fabricating a semiconductor device. The method 100 begins at block 102 where a substrate is provided. The substrate is a semiconductor substrate. Referring to the example of FIG. 2, a semiconductor device 200 includes a semiconductor substrate 202. In an embodiment, the substrate 202 is silicon in a crystalline structure. Other exemplary materials include other elementary semiconductors such as germanium, or compound semiconductors such as, silicon carbide, gallium arsenide, indium arsenide, and indium phosphide. The substrate 202 may be a silicon-on-insulator (SOI) substrate.

The substrate 202 includes active regions 204 and an isolation region 206. The active regions 204 may be suitably doped to provide a region for formation of active devices such as, an NMOS field effect transistor (NFET) or PMOS field effect transistor (PFET) semiconductor device. Though as illustrated herein the NFET region is provided on the relative left and the PFET region is provided on the relative right, with the isolation region 206 interposing the two, numerous configurations are possible.

The isolation region 204 is a shallow trench isolation (STI) structure. The STI structure may be formed by etching an aperture in the substrate 202 using processes such as reactive ion etch (RIE) after photolithography patterning, and/or other suitable processes. The apertures may then be filled with an insulator material, such as an oxide. In an embodiment, the process includes conformal low-pressure chemical vapor deposition (LPCVD) of oxide to fill an aperture, and continues with a chemical mechanical polish (CMP) process to planarize the oxide. Other suitable processes may be used in addition and/or in lieu of those described. In other embodiments, other isolation structures (e.g., LOCOS, field oxidation), may be used in addition to or in lieu of STI structures.

Referring again to FIG. 1, the method 100 then proceeds to block 104 where a gate structure (e.g., stack) is provided. Referring to the example of FIG. 2, gate structures 208 are disposed on the substrate 202. The gate structures 208 include gate structures that are, or will be formed into, gates of active (operational) devices (e.g., NFET or PFET devices). The gate structures 208 may be dummy gates (e.g., sacrificial gates) used in a gate replacement (also known as "gate-last") process of forming metal gate structures for operational devices. The gate structures 208 include one or more layers such as interface layers, gate dielectric layers, gate electrodes, hard mask layers, capping layers, work function layers, and/or other suitable layers. One or more of the layers may be sacrificial (e.g., as provided in a gate replacement process).

The gate structures 208 include a gate dielectric layer 210. The gate dielectric layer 210 may include a dielectric material such as, silicon oxide, silicon nitride, silicon oxynitride, dielectric with a high dielectric constant (high k), and/or combinations thereof. Examples of high k materials include hafnium silicate, hafnium oxide, zirconium oxide, aluminum oxide, hafnium dioxide-alumina ($HfO_2$—$Al_2O_3$) alloy, or combinations thereof. The gate dielectric layer 210 may be formed using conventional processes such as, photolithography, oxidation, deposition, etching, and/or a variety of other processes known in the art. The gate dielectric layer 210 may be sacrificial, and subsequently replaced by a functional gate dielectric layer in a replacement process; in other embodiments, the gate dielectric layer 210 remains in the final device.

In an embodiment, the gate structure 208 includes a gate electrode layer 212. In an embodiment, the gate electrode 212 includes polysilicon. In embodiments, the gate electrode 212 is a sacrificial layer, which is subsequently replaced in a "gate last" or replacement gate process. The gate electrode layer 212 may be formed by suitable methods such as, physical vapor deposition (PVD) (sputtering), chemical vapor deposition (CVD), plasma-enhanced chemical vapor deposition (PECVD), atmospheric pressure chemical vapor deposition (APCVD), low-pressure CVD (LPCVD), high density plasma CVD (HDPCVD), atomic layer CVD (AL-CVD), and/or other processes known in the art followed by a photolithography and etching processes. In other embodiments, the gate electrode 212 includes a metal composition such as, Cu, W, Ti, Ta, TiN, TaN, NiSi, CoSi, combinations thereof, and/or other suitable materials.

In embodiments, the gate structure 208 also includes a hard mask layer 214, which overlies the gate electrode layer 212. The hard mask layer 214 may include silicon oxide. Alternatively, the hard mask layer 214 may be silicon nitride, silicon oxynitride, and/or other suitable dielectric materials. The hard mask layer 214 may be formed using a method such as CVD, PVD, and/or other suitable processes.

Referring again to FIG. 1, the method 100 then proceeds to block 106 where a source/drain region is formed. The source/drain region may be or include a lightly doped source/drain region (also referred to as a low-dose region, a low-dose source/drain, or LDD). Referring to the example of FIG. 2, LDD regions 215 are disposed in the substrate 202. The height of the gate structure 208 including the height of the hard mask layer 208 may influence an implant (e.g., implant angle) of the LDD region 215. The LDD region 215 may be formed using ion implantation of a suitable dopant (e.g., n-type or p-type), diffusion, and/or other suitable CMOS processes. The LDD region 215 may include a pocket implant. The source/drain implant process (e.g., the LDD implant for the N/P FET) may be followed by an anneal step. In an embodiment, the anneal is a single-step anneal (SSA).

Referring again to FIG. 1, the method 100 then proceeds to block 108 where a first spacer material is deposited on the substrate. The first spacer material may be formed by PECVD and/or other suitable processes. The first spacer material may be a liner of a spacer element. Referring to the example of FIG. 2, spacer material 216 is disposed on the substrate 102. The spacer material 216 may be a conformal layer with substantially uniform thickness (e.g., accounting for fabrication process limitations). The spacer material 216 may also be referred to as a spacer element liner layer. The spacer material 216 may include silicon and carbon. In an embodiment, the spacer material 216 is SiCN. In another embodiment, the spacer material 216 is SiC. Other embodiments may include various other low-etch rate materials (e.g., low wet etching rate materials) compatible with CMOS processing. A low etch rate material may be one with a low etching rate in wet chemistry etches such as, HF, phosphoric acid, and/or other etchants typically used in processing, for example, to remove oxide films. In an embodiment, the material is selected such that it is substantially unetched by one or more of the wet chemistries described above. The spacer material 216 abuts the sidewalls of the gate structure 208 including covering the sidewalls of the gate electrode 212. In an embodiment, the spacer material 216 has a thickness of less than approximately 100 Angstroms.

Embodiments including the first spacer material may be advantageous in that the first spacer material (e.g., a low etch rate film) protects a gate sidewall to protect the critical dimension of the device during removal of one or more layers from the substrate, for example, removal of a dummy poly gate electrode. Other embodiments may include advantages such as protection of the gate sidewalls which may protect the gate CD during etching processes (e.g., wet etching). In conventional embodiments, wet etch processes (e.g., oxide etches) may damage spacer materials causing a drift in the critical dimensions of associated date structures. The first spacer material may also act to define a cavity (e.g., as a wall) for a subsequently formed metal-gate. These features are described further below.

Figure 3:
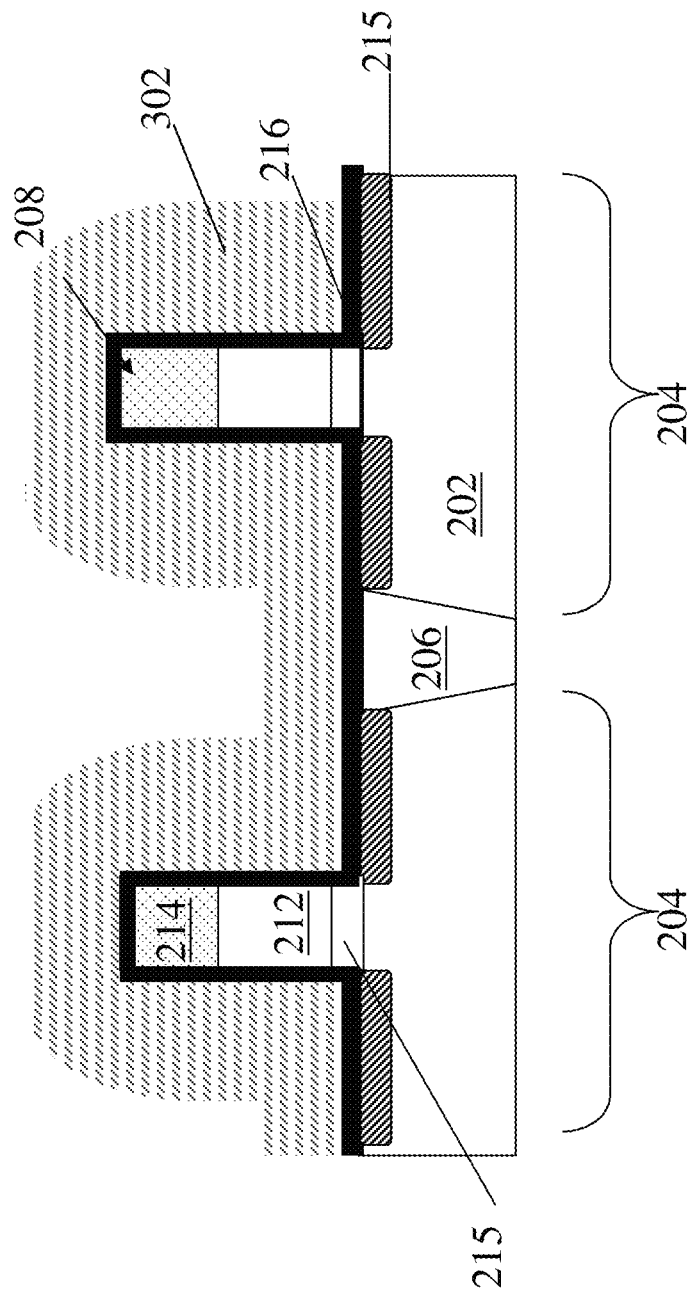

Referring again to FIG. 1, the method 100 then proceeds to block 110 where a second spacer material is deposited. The second spacer material may be deposited using physical vapor deposition (PVD) (sputtering), chemical vapor deposition (CVD), plasma-enhanced chemical vapor deposition (PECVD), atmospheric pressure chemical vapor deposition (APCVD), low-pressure CVD (LPCVD), high density plasma CVD (HDPCVD), atomic layer CVD (ALCVD), and/or other suitable processes. Referring to the example of FIG. 3, a spacer material 302 is deposited on the substrate 202. The spacer material 302 overlies the first spacer material 216. It is noted that in some embodiments there is no etch process performed on the spacer material 216 prior to the deposition of the spacer material 302. The spacer elements 302 may comprise silicon nitride. Other exemplary compositions include silicon oxide, silicon carbide, silicon oxynitride, combinations thereof, and/or other suitable materials. The spacer material 302 may be referred to as material for forming a main spacer.

The spacer material 302 and the spacer material 216 may be formed in-situ or at least substantially simultaneously (i.e., without interposing processing steps).

Figure 4:
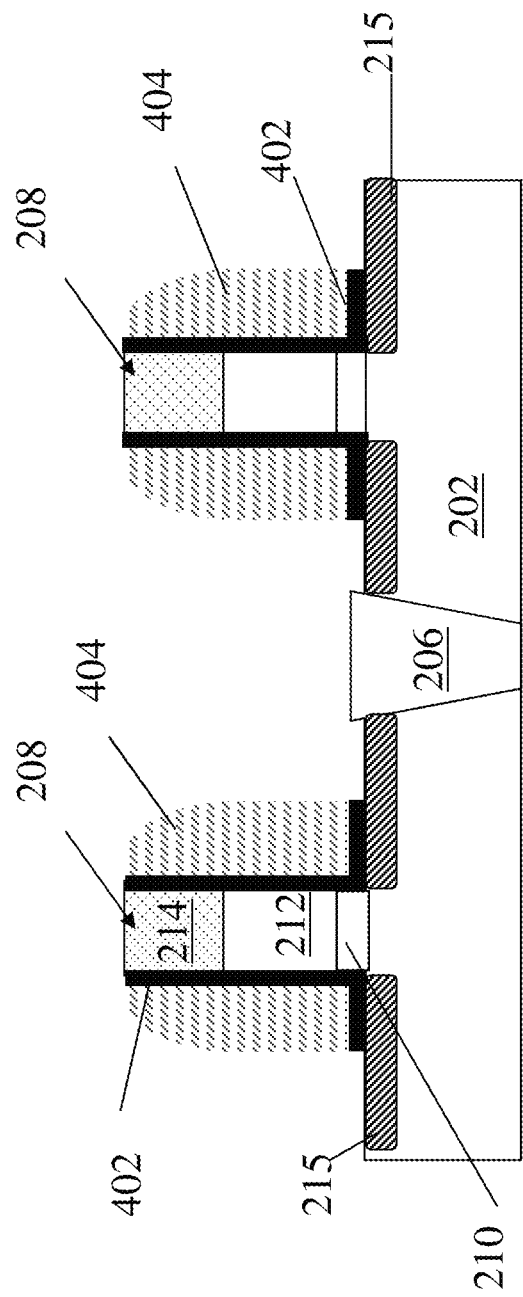

Referring again to FIG. 1, the method 100 then proceeds to block 112 where the spacer material is etched. The etching process may include an isotropic wet etch, dry etch, and/or other etching processes typical of CMOS fabrication processes. Referring to the example of FIG. 4, the spacer material 216 and the spacer material 302 have been etched forming spacers 402 and 404, respectively (i.e., first spacers 402 and second spacers 404). The spacer material 216 and the spacer material 302 have been removed from the substrate 202 in regions where an epitaxy region or raised source/drain will be formed. The first spacer material 216 may be removed from a top surface of a gate structure and/or portions of the surface of the substrate 202 where an epitaxy region will be grown. In an embodiment, the second spacer material forms a second spacer 404 which is approximately 20 nanometers in thickness. The spacer material 216 and/or the first spacer 402 may be approximately 100 Angstroms or less in thickness. The first spacer 402 may be referred to spacer element liner. The second spacer 404 may be referred to as a main spacer. It is noted that in the illustrated embodiment the spacer element 402 includes an L-type shape.

Included in, or in addition to, the spacer elements 402 and 404, a plurality of layers including those layers defining a wall for the gate structures 208 (e.g., in a replacement gate process), offset spacers, spacers that define a low-dosed region, liners, spacers that define a raised/source drain (e.g., epitaxy) region, and other suitable functions may be disposed on the substrate 202. In embodiments, the second spacer elements 404 are referred to as main spacer elements and/or the first spacer elements 402 are referred to as an offset spacer element. The first spacer 402 and/or the second spacer 404 may serve to define a region of the source/drain. The first spacer 402 and/or the second spacer 404 may serve to define an epitaxy region (e.g., define or set an edge of an epitaxy region).

The spacer elements of blocks 108, 110 and 112 (in an embodiment, the spacer elements 402 and 404) may be formed substantially simultaneously (i.e., without intervening processes directed to other features of a device).

Figure 5:
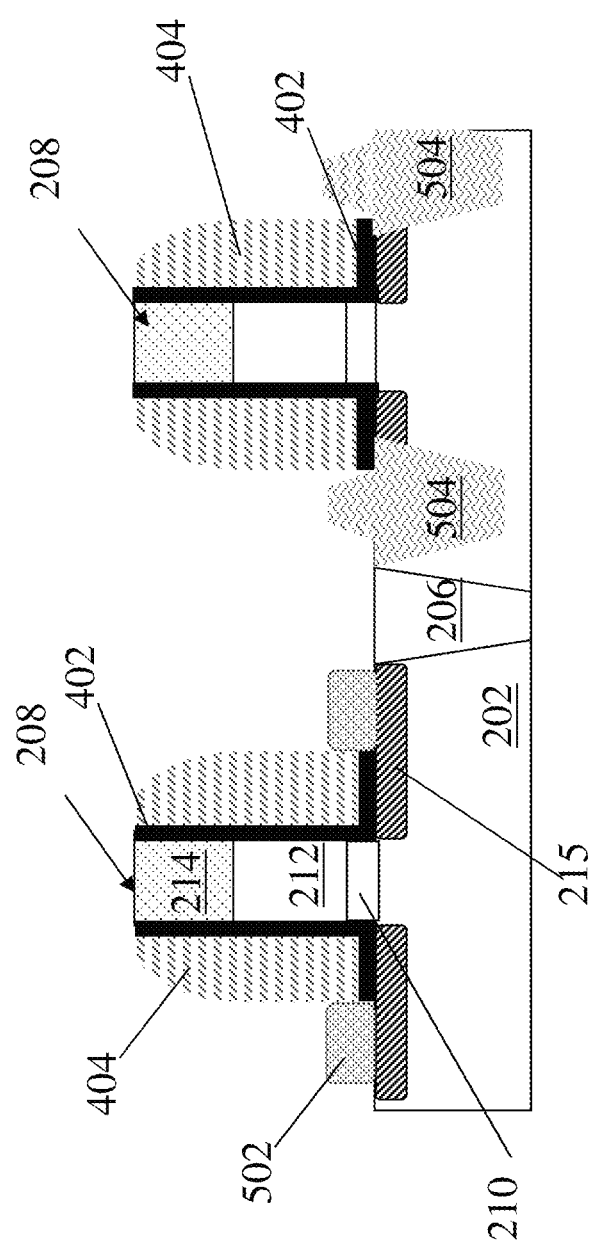

The method 100 then proceeds to block 114 where an epitaxy region is formed on the substrate. Referring to the example of FIG. 5, the epitaxy regions 502 and 504 are formed on the substrate. In an embodiment, the epitaxy region 502 is a silicon epitaxy region. The epitaxy region 502 may provide the source/drain for an active device such as an NFET. In an embodiment, the epitaxy region 504 is a silicon germanium epitaxy region. The epitaxy region 504 may provide the source/drain for an active device such as a PFET. However, numerous other embodiments of epitaxially grown materials are possible such as, silicon, silicon germanium, silicon carbide, germanium, gallium arsenide, indium phosphide, and/or other suitable materials. The epitaxy regions 502 and 504 may be raised source/drain regions (see FIG. 5), or in other embodiments, regions formed in the substrate 202 (e.g., having an approximately co-planar top surface with the substrate 202).

There may be an epitaxial growth selectivity between the substrate 202 and the spacer 404. This provides a suitable shape and/or position of the epitaxial region 504. Additionally, the spacer 404 may act as a protective element to protect (e.g., shield) the spacer 402 and the sidewall of the gate stack 208 during the epitaxial process.

It is noted that the first spacer element 402 may protect the sidewall of the gate structure 208 during an epitaxial growth process. In an embodiment, the gate electrode layer 212 includes polysilicon. The first spacer element 402 protects the gate electrode layer 212 including its sidewall from undesired growth of epitaxy material during the growth process of forming the regions 502 and/or 504. Thus, the thickness of the hard mask layer 214, which may ensure the gate electrode 212 is not exposed during loss of spacer height, may be decreased from conventional processes. In an embodiment, the hard mask layer 214 is between approximately 700 A and approximately 950 A in thickness. In comparison to a process having multiple etches to form the spacers (e.g., first spacer material deposited and etched, second spacer material deposited and etched), this allows for a decreased hard mask thickness as less material may be lost to the etching processes. A decreased hard mask layer 214 may allow for a more desirable (e.g., larger) pocket implant angle. The spacer element 402 also allows for controlled spacer edge loss during etching processes for epitaxy volume control (e.g., critical dimension, CD). In one or more embodiments, this is because the spacer element 402 includes a low-etch rate material (e.g., SiCN, SiC).

Figure 6:
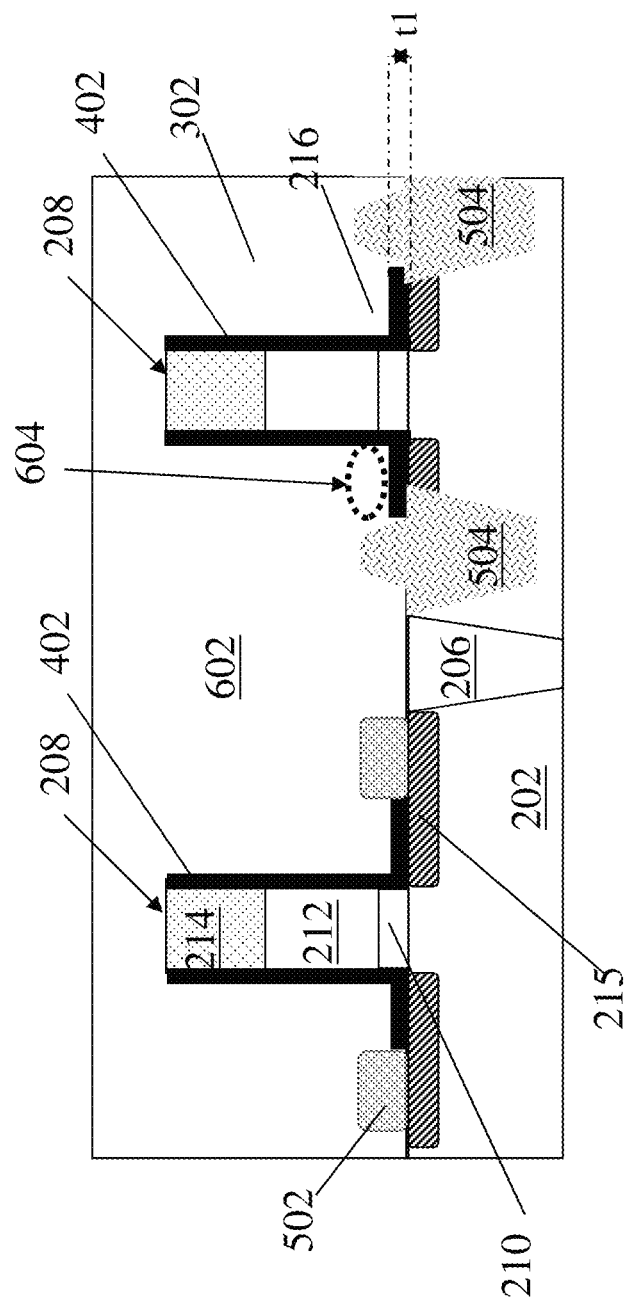

The method 100 then proceeds to block 116 where the second spacer element is removed from the substrate. The second spacer element may be removed using a suitable wet or dry etching process typical of CMOS fabrication. Referring to the example of FIG. 6, the device 600 illustrates the removal of the spacer elements 404. The spacer element 402 remain on the substrate 202. The spacer element 402 may remain on the substrate.

The method 100 then proceeds to block 118 where an interlayer dielectric (ILD) layer is formed on the substrate. Referring to the example of FIG. 6, an ILD layer 602 is formed on the substrate 202. The ILD layer 602 may include may include dielectric materials such as, tetraethylorthosilicate (TEOS) oxide, un-doped silicon glass, or doped silicon oxide such as borophosphosilicate glass (BPSG), fused silica glass (FSG), phosphosilicate glass (PSG), boron doped silicon glass (BSG), SILK (a product of Dow Chemical of Michigan), BLACK DIAMOND (a product of Applied Materials of Santa Clara, Calif.), and/or other materials known in the art. The ILD layer 602 may be deposited by PECVD, spin-on coating, and/or other suitable deposition processes.

It is noted that the presence of the spacer element 402 may be advantageous in decreasing an aspect ratio of a fill region for the ILD layer 602 (e.g., provide improved gap fill). For example, identified region 604 illustrates a reduced aspect ratio due to the presence of the spacer element 402. The thickness of the spacer element 402, t1, may be less than approximately 100 angstroms. The thickness of the spacer element 402 serves to decrease the depth of the region to fill between the epitaxy region 502/504 and the gate structure 208. The spacer element 402 may also define a cavity (e.g., protect the CD of a gate) for a gate-last process, within which a metal gate is formed. Thus, the spacer element 402 may include a composition that is selective to one or more etch processes used to remove and replace a dummy gate (e.g., HF dry etch). In an embodiment, the spacer element 402 is of a different material than the dielectric 210. In an embodiment, the dielectric 210 is a dummy gate dielectric and the spacer element 402 is comprised such that the spacer element 402 is not attacked (e.g., removed) during the removal of the dummy gate dielectric 210.

It is understood that the method 100 may continue with a CMOS process flow to form various structures and features such as silicide features, contact etch stop layers (CESL), additional inter-level dielectric (ILD) layers, contact/vias, interconnect layers, metal layers, dielectric layers, passivation layer and so forth. In an embodiment, the gate structures fabricated as described above, including in block 104, remain in the final circuit. In other embodiments, the gate structures are partially and/or completely removed and the resulting trench refilled with materials proper for forming a gate of a semiconductor device. Various layers of a multiple layer interconnect (MLI) are formed on the substrate to connect the various features described above.

Figure 7:
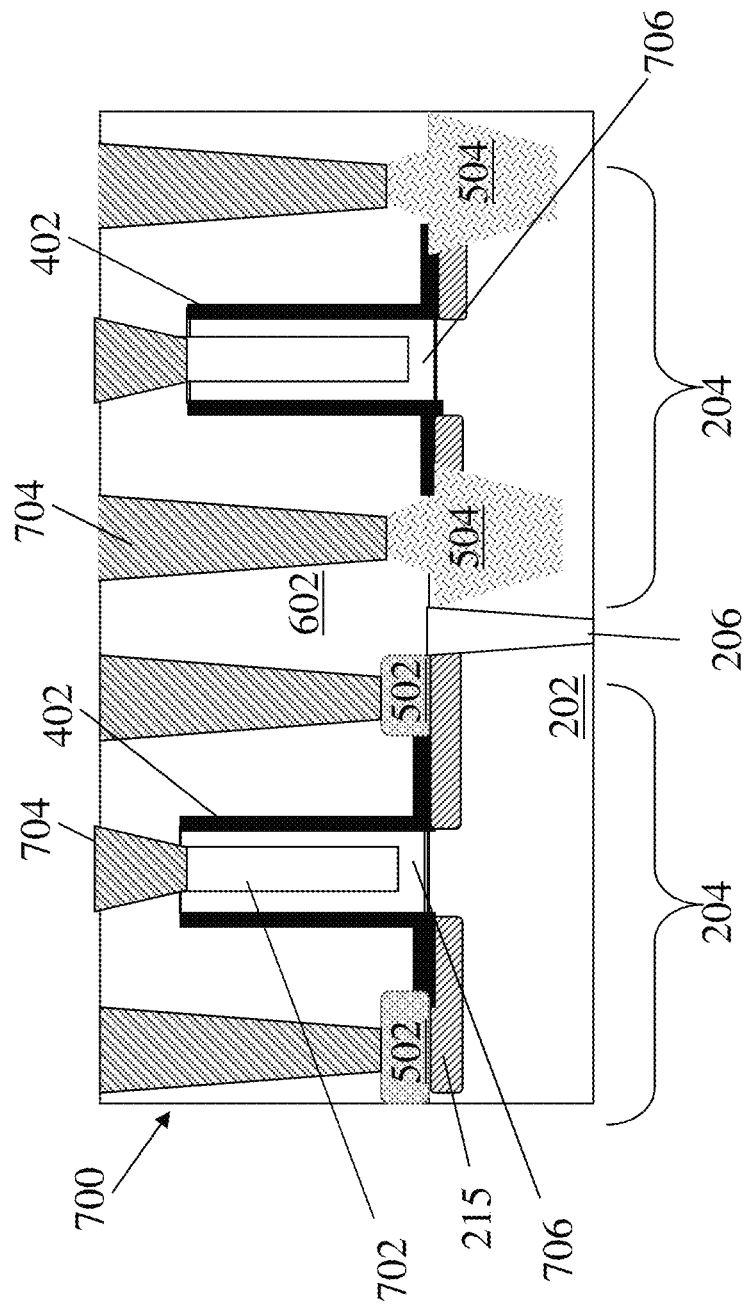
FIG. 7 is a cross-sectional view of an embodiment of a semiconductor device according to one or more aspects of the present disclosure.

Referring now to FIG. 7, illustrated is a device 700 that includes one or more aspects of the present disclosure. The device 700 may be substantially similar to the devices of FIGS. 2, 3, 4, 5, and/or 6, and/or fabricated using one or more elements of the method 100, all described above.

The device 700 includes a semiconductor substrate 202 having active regions 204 and an isolation region 206 interposing the active regions 204, lightly doped source and drain (LDD) regions 215, epitaxy regions 502 and 504, an ILD layer 602, and spacer elements 402. The spacer elements 402 may be a liner layer of a spacer with one or more layers. One or more of these elements may be substantially similar to as described above with reference to the method 100. The spacer elements 402 may include silicon and/or carbon, selected, for example, to provide a low etch rate. In an embodiment, the spacer elements 402 are SiCN. In an embodiment, the spacer elements 402 are SiC. The spacer elements 402 have an interface (e.g., region in direct contact) with the epitaxy region 502 or 504. It is noted that the device 700 is also advantageous in that the ILD layer 602 has improved gap fill due to the reduction of the aspect ratio between a region between the epitaxy regions 502/504 and the adjacent gate structure.

The gate structures of the device 700 may be substantially similar to the gate structures 208 described above with reference to FIGS. 1 and 2. The gate structures include a gate dielectric 210 and a gate electrode 702. The gate dielectric 210 may be substantially similar to as described above with reference to FIGS. 1 and 2. In embodiments, the gate electrode 702 is a metal gate with the gate electrode including a metal composition. Examples of suitable metals for forming the gate electrode include Cu, W, Ti, Ta, TiN, TaN, NiSi, CoSi, combinations thereof, and/or other suitable materials. The gate structure of the device 700 may further comprise a contact layer disposed over the gate electrode to reduce contact resistance and improve performance. The contact layer may include metal silicide. The device 700 further includes contact features 704. The contact features 704 may be tungsten plugs, and/or other suitable elements typical of a CMOS process. The gate structure of the device 700 further includes a gate dielectric 706. The gate dielectric 706 may include a dielectric material such as, silicon oxide, silicon nitride, silicon oxynitride, dielectric with a high dielectric constant (high k), and/or combinations thereof. Examples of high k materials include hafnium silicate, hafnium oxide, zirconium oxide, aluminum oxide, hafnium dioxide-alumina ($HfO_2$—$Al_2O_3$) alloy, or combinations thereof. The gate dielectric layer 706 may be formed using conventional processes such as, photolithography, oxidation, deposition, etching, and/or a variety of other processes known in the art. The gate dielectric layer 706 may be a replacement dielectric, for example, for gate dielectric 210 illustrated above.

Figure 8:
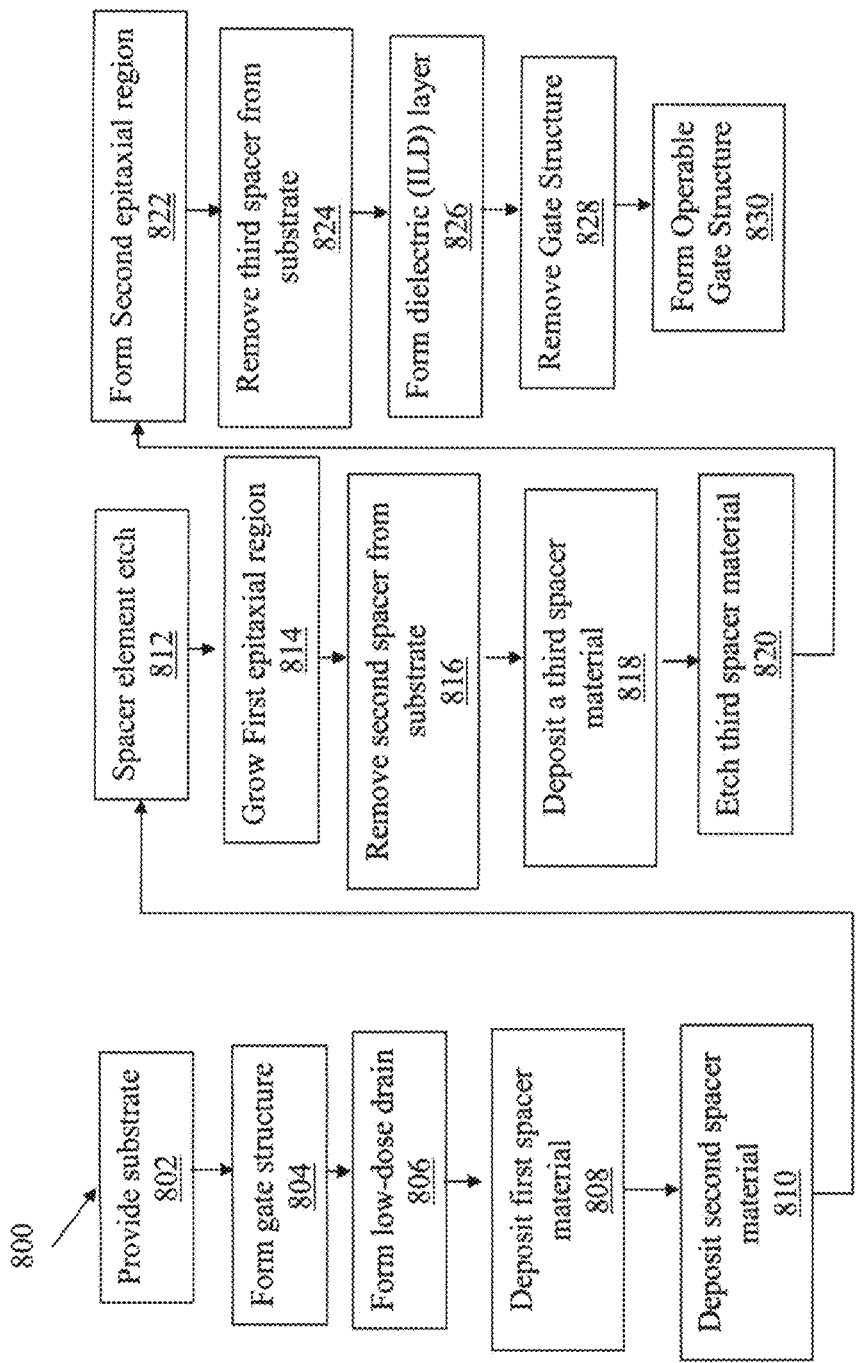
FIG. 8 is a flowchart illustrating an embodiment of a method according to one or more aspects of the present disclosure.

Referring now to FIG. 8, illustrated is an embodiment of a method 800 of fabricating a semiconductor device. The method 800 is substantially similar to the method 100, with differences detailed herein. Blocks 802, 804, 806, 808, and 810 are substantially similar to similarly labeled blocks 102, 104, 106, 108, and 110 of the method 100.

The method 800 then proceeds to block 812 where the spacer material is etched. The etching process may include an isotropic wet etch, dry etch, and/or other etching processes typical of CMOS fabrication processes. Referring to the example of FIG. 9, the spacer material 216 and the spacer material 302, see FIG. 3, have been etched forming spacers 902 and 904, respectively (i.e., first spacers 902 and second spacers 904).

The spacer material 216 and the spacer material 302 have been removed from the substrate 202 in regions where a first epitaxy region will be formed. The spacer material 216 and/or the first spacer 902 may be approximately 100 Angstroms or less in thickness. The first spacer 902 may be referred to spacer element liner. The second spacer 904 may be referred to as a main spacer. It is noted that in the illustrated embodiment the spacer element 902 includes an L-type shape.

Figure 9:
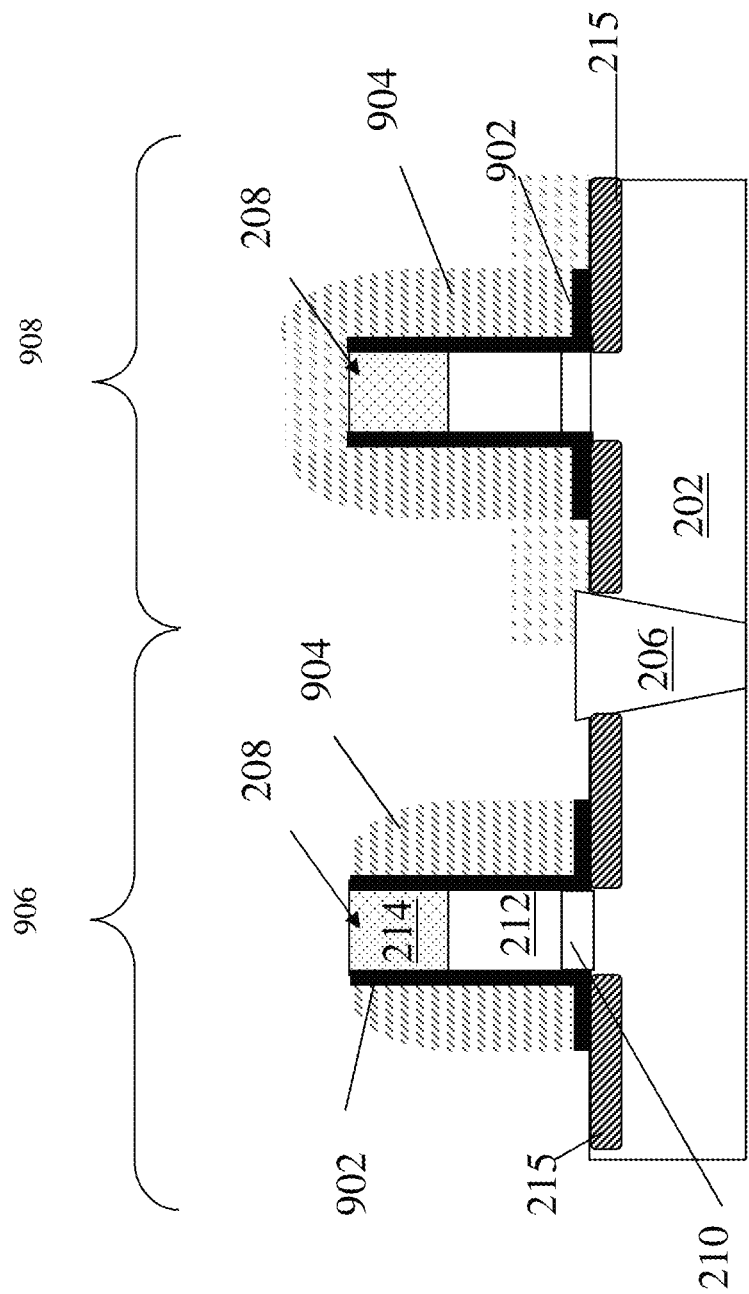
FIGS. 9-17 are cross-sectional views of an embodiment of a semiconductor device corresponding to steps of the method of FIG. 8.

The embodiment of FIG. 9 illustrates the second spacer 904 remains over the region 908. The region 908 may be a PFET device region. The second spacer 904 include a composition that is selective to an epitaxial growth process performed on the substrate 202 (i.e., will not grow epi thereon). In an embodiment, the second spacer 904 is SiN. In an embodiment, the first spacer 902 is SiCN.

Figure 10:
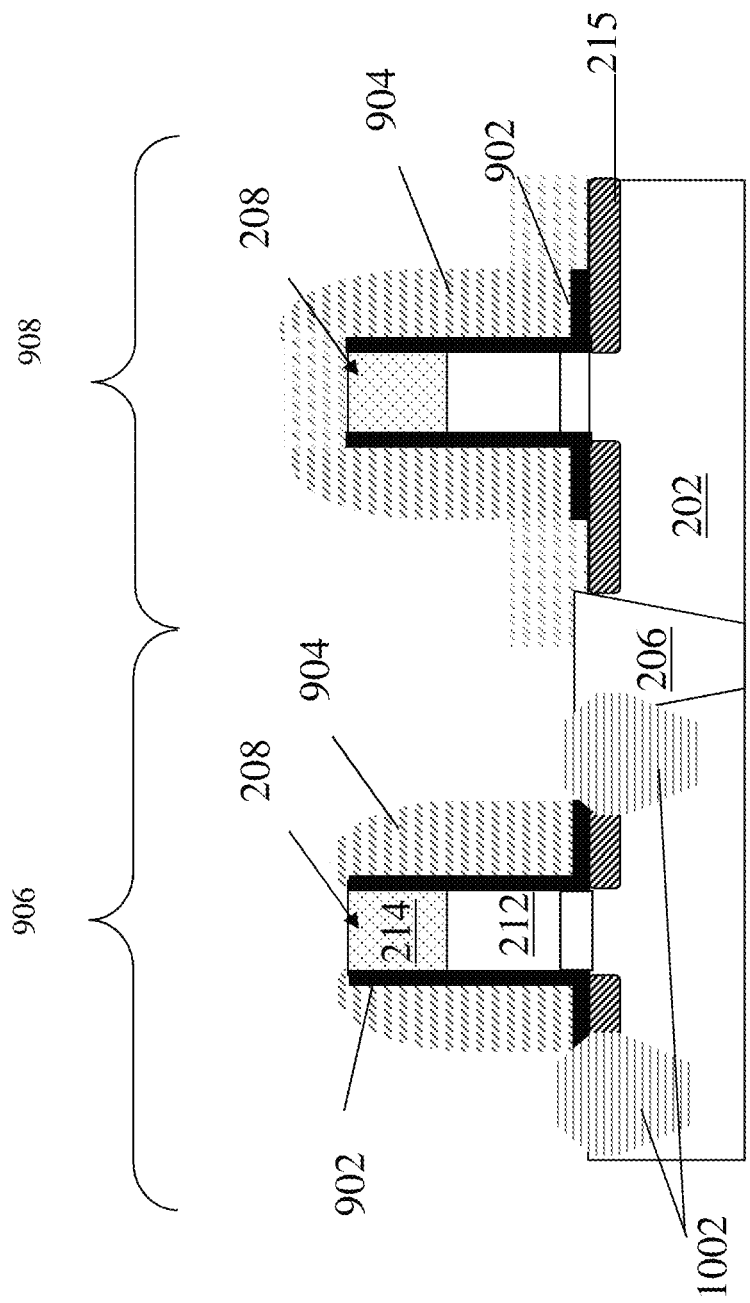

The method 800 then proceeds to block 814 where a first epitaxial region is grown. Block 814 may be substantially similar to block 114 of the method 100, described above. In an embodiment, the first epitaxial region is provided to form a source/drain region of a device (e.g., NFET). The epitaxy process may include an in-situ provided dopant, preclean processes, and/or other suitable processes. Referring to the example of FIG. 10, epitaxy regions 1002 are disposed on the substrate 202. The epitaxy regions 1002 may be silicon epitaxy. The regions 1002 may be doped or un-doped. The epitaxy regions 1002 may form a source/drain region for a device formed in the region 906. In an embodiment, the region 906 defines an NFET device region. In other words, in an embodiment the epitaxy regions 1002 form a source/drain region of an NFET device. The spacers 904 and/or 902 may provide protection from unwanted epitaxial growth, for example, on the gate structure 208. It is noted that spacer 904 may encase the spacer 902 (e.g., including the top surface of the spacer 902).

Figure 11:
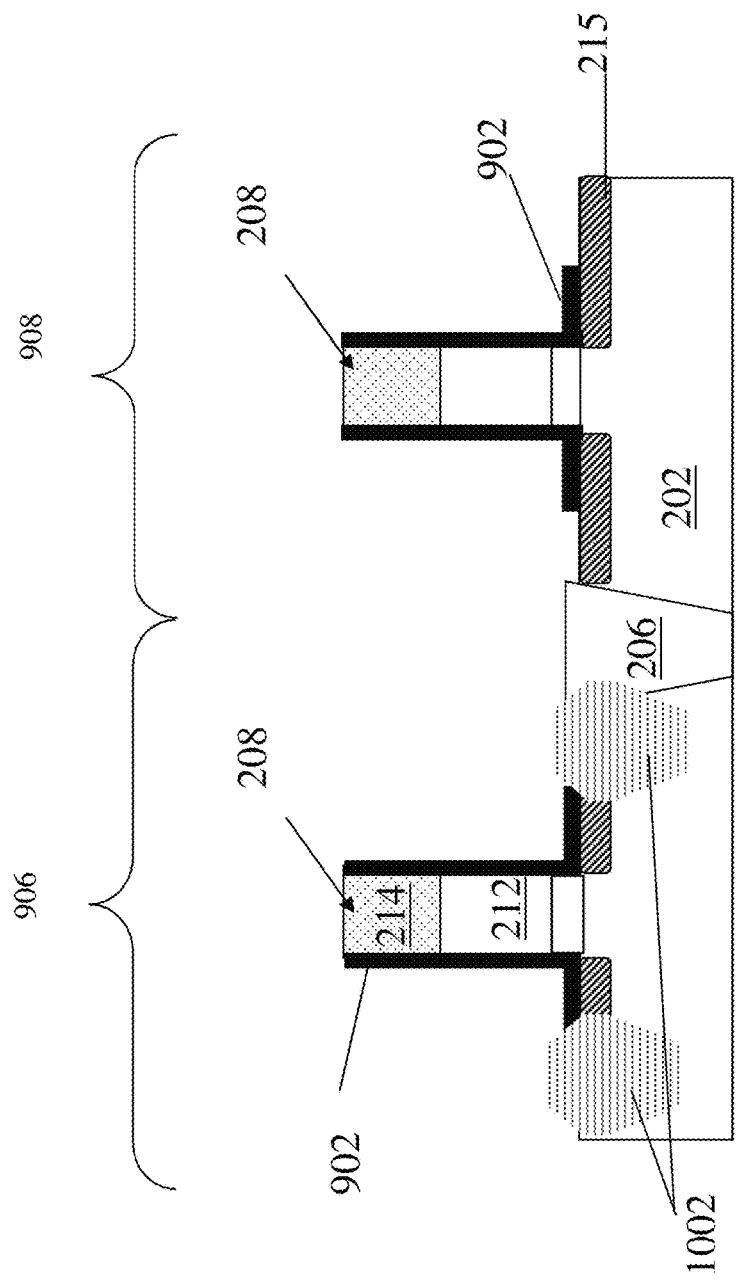

The method 800 then proceeds to block 816 where the second spacer is removed from the substrate. Block 816 may be substantially similar to block 116, described above with reference to the method 100 of FIG. 1. In an embodiment, the second spacer is removed using a wet etchant such as, $H_3PO_4$. Referring to the example of FIG. 11, the spacer element 904 is removed.

Figure 12:
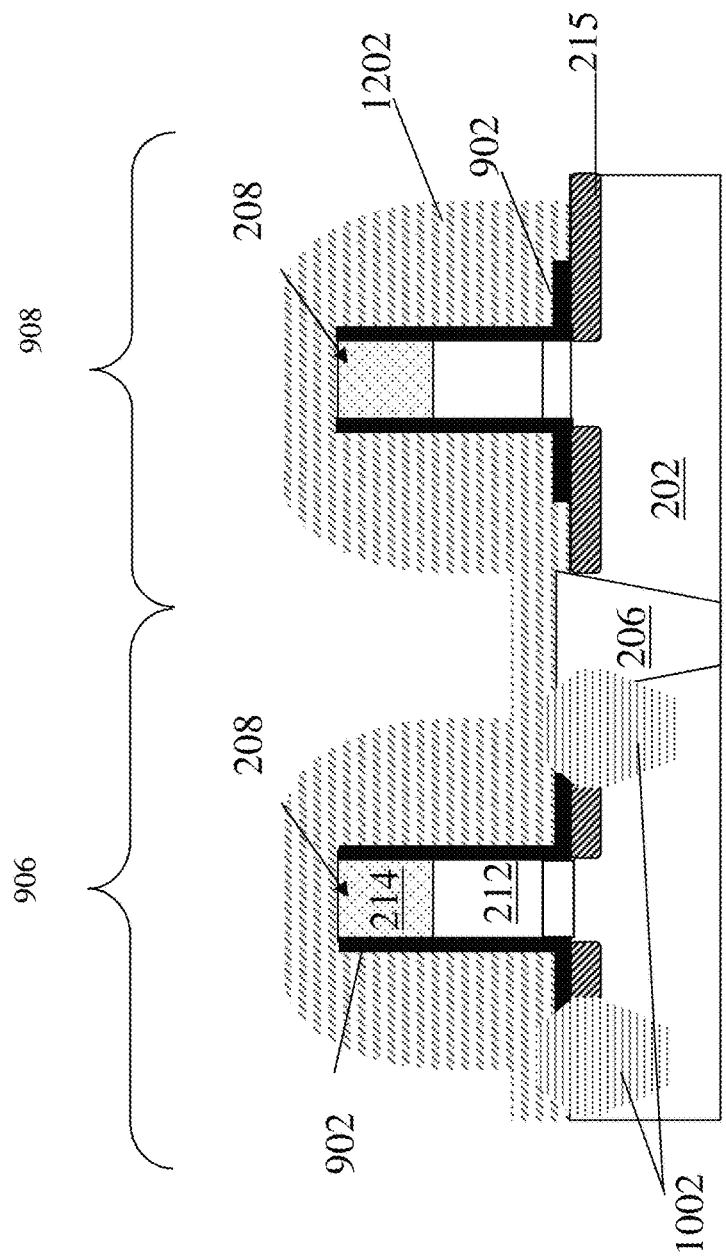

The method 800 then proceeds to block 818 where a third spacer material is formed on the substrate. The third spacer material may be substantially similar to the second spacer material described above. Block 818 may be substantially similar to block 810 and/or block 110 of the method 100. Referring to the example of FIG. 12, third spacer material 1202 is formed on the substrate 202.

Figure 13:
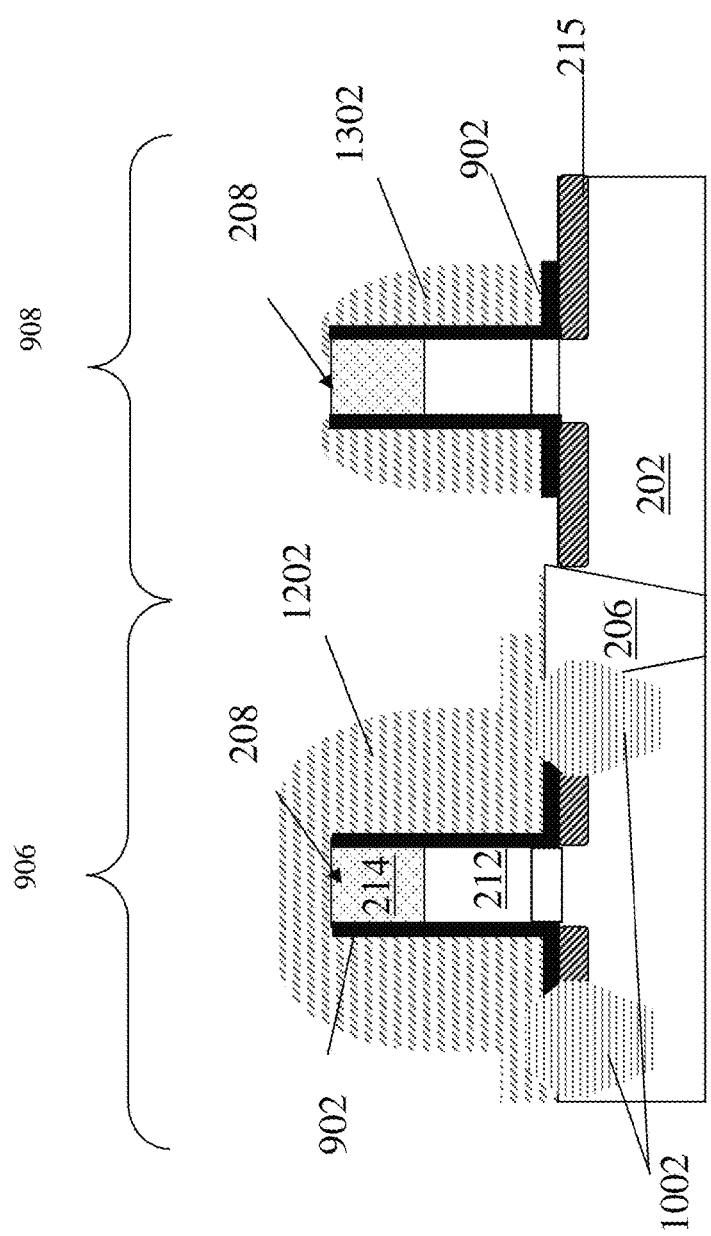

The method 800 then proceeds to block 820 where the third spacer material is etched from a region of the substrate. The etching process may include an isotropic wet etch, dry etch, and/or other etching processes typical of CMOS fabrication processes. Referring to the example of FIG. 13, the spacer material 1202 has been etched forming spacers 1302 in region 908. In an embodiment, region 908 defines a PFET device region. More specifically, the spacer material 1202 has been removed from the substrate 202 in regions where a second epitaxy region will be formed. The spacer material 1202 remains in the region 906 (e.g., NFET device region).

Figure 14:
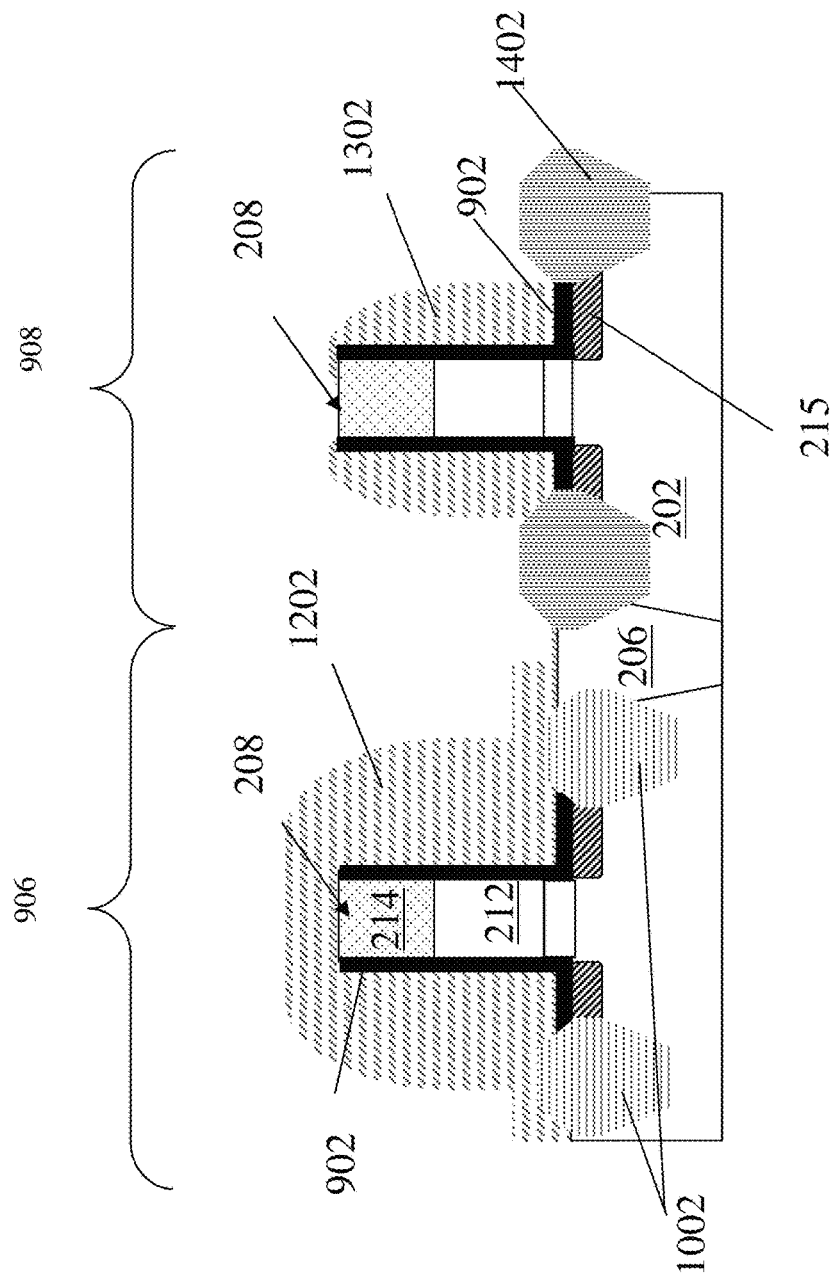

The method 800 then proceeds to block 822 where a second epitaxial region is formed. Block 822 may be substantially similar to block 114 of the method 100, described above. In an embodiment, the second epitaxial region is provided to form a source/drain region of a device (e.g., PFET). The epitaxy process may include forming a trench in the substrate within which the epitaxy is grown. The epitaxy process may further include an in-situ provided dopant, preclean processes, and/or other suitable processes. In an embodiment, the second epitaxial region is silicon germanium. Referring to the example of FIG. 14, epitaxy regions 1402 are disposed on the substrate 202. The epitaxy regions 1402 may be SiGe. The epitaxy regions 1002 may form a source/drain region for a device formed in the region 908. In an embodiment, the region 908 defines a PFET device region. In other words, in an embodiment the epitaxy regions 1402 form a source/drain region of a PFET device. The epitaxy region 1402 may provide a raised source/drain region.

Figure 15:
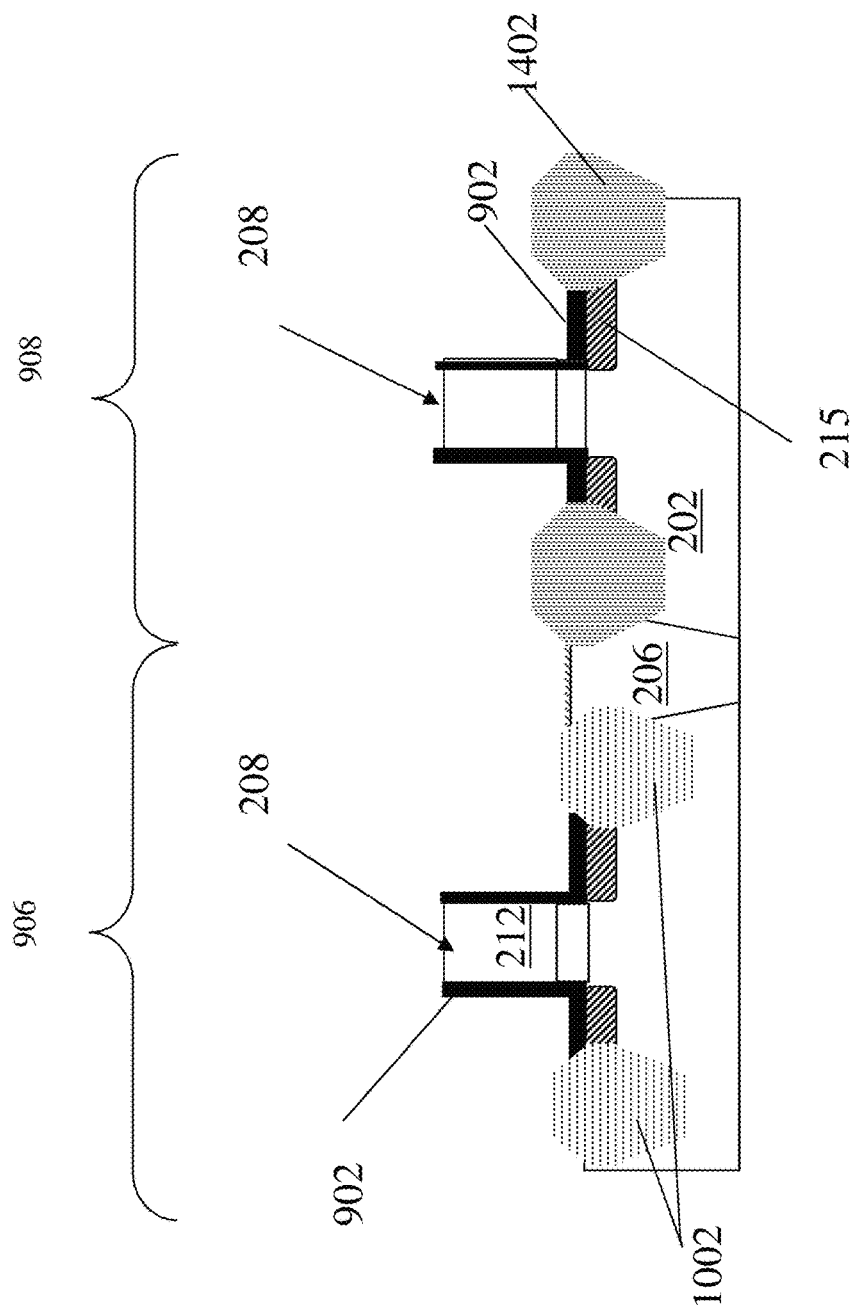

The method 800 then proceeds to block 824 where the third spacer is removed from the substrate. Block 824 may be substantially similar to block 116, described above with reference to the method 100 of FIG. 1 and/or block 816 described above. In an embodiment, the third spacer is removed using a wet etchant such as, $H_3PO_4$. Referring to the example of FIG. 15, the spacer element 1302 and the spacer material 1202 is removed. In embodiments, the hard mask layer 214 may be removed and the portion of the spacers adjacent the hard mask layer 214 sidewalls in the same or subsequent process.

Figure 16:
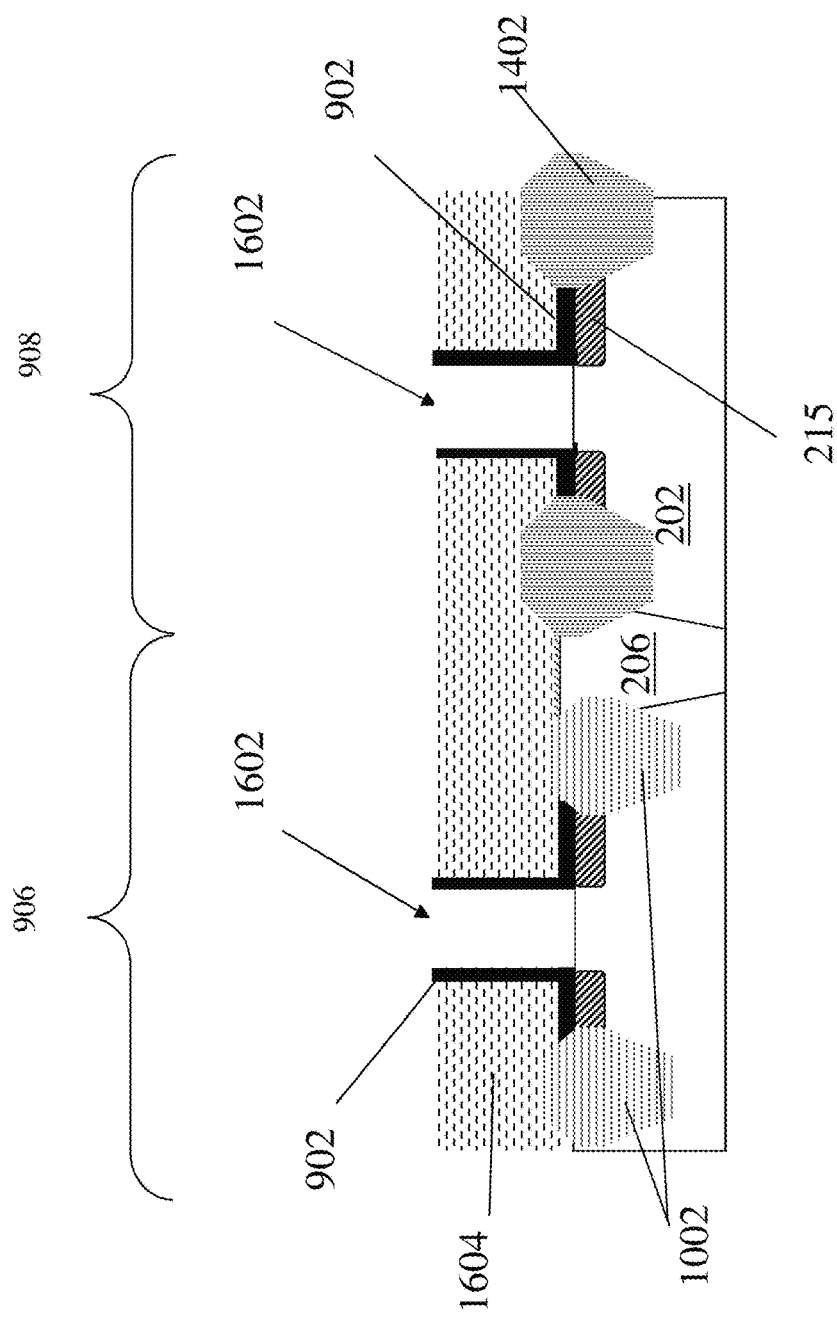

The method 800 then proceeds to block 826 where a dielectric layer is formed on the substrate. The block 826 may be substantially similar to block 118, described above with reference to the method 100 of FIG. 1. After depositing the dielectric material, a chemical mechanical polish process may be performed. The method 800 may include advantages in the formation of the dielectric layer as it has an improved gap fill because of the presence of the first spacers. Referring to the example of FIG. 16, an ILD layer 1604 is formed on the substrate 202. The ILD layer 1604 may include may include dielectric materials such as, tetraethylorthosilicate (TEOS) oxide, un-doped silicon glass, or doped silicon oxide such as borophosphosilicate glass (BPSG), fused silica glass (FSG), phosphosilicate glass (PSG), boron doped silicon glass (BSG), SILK (a product of Dow Chemical of Michigan), BLACK DIAMOND (a product of Applied Materials of Santa Clara, Calif.), and/or other materials known in the art. The ILD layer 1604 may be deposited by PECVD, spin-on coating, and/or other suitable deposition processes. The ILD layer 1604 of FIG. 16 is illustrated after CMP.

The method 800 then proceeds to block 828 where the gate structure is removed. The gate structure is described above with reference to block 804 and may include a dummy gate structure. It is noted that a portion of the dummy gate structure (e.g., hard mask layer) may have been previously removed. The dummy gate structure may be removed using an etchant such as HF. The spacer elements 902 may be formed of a material that is resistant (e.g., has a high etch selectivity) to the etchant. Referring to the example of FIG. 16, the gate electrode layer 212 and the gate dielectric layer 210, both sacrificial (or dummy) features, have been removed leaving trench 1602 defined by the spacer elements 902.

Figure 17:
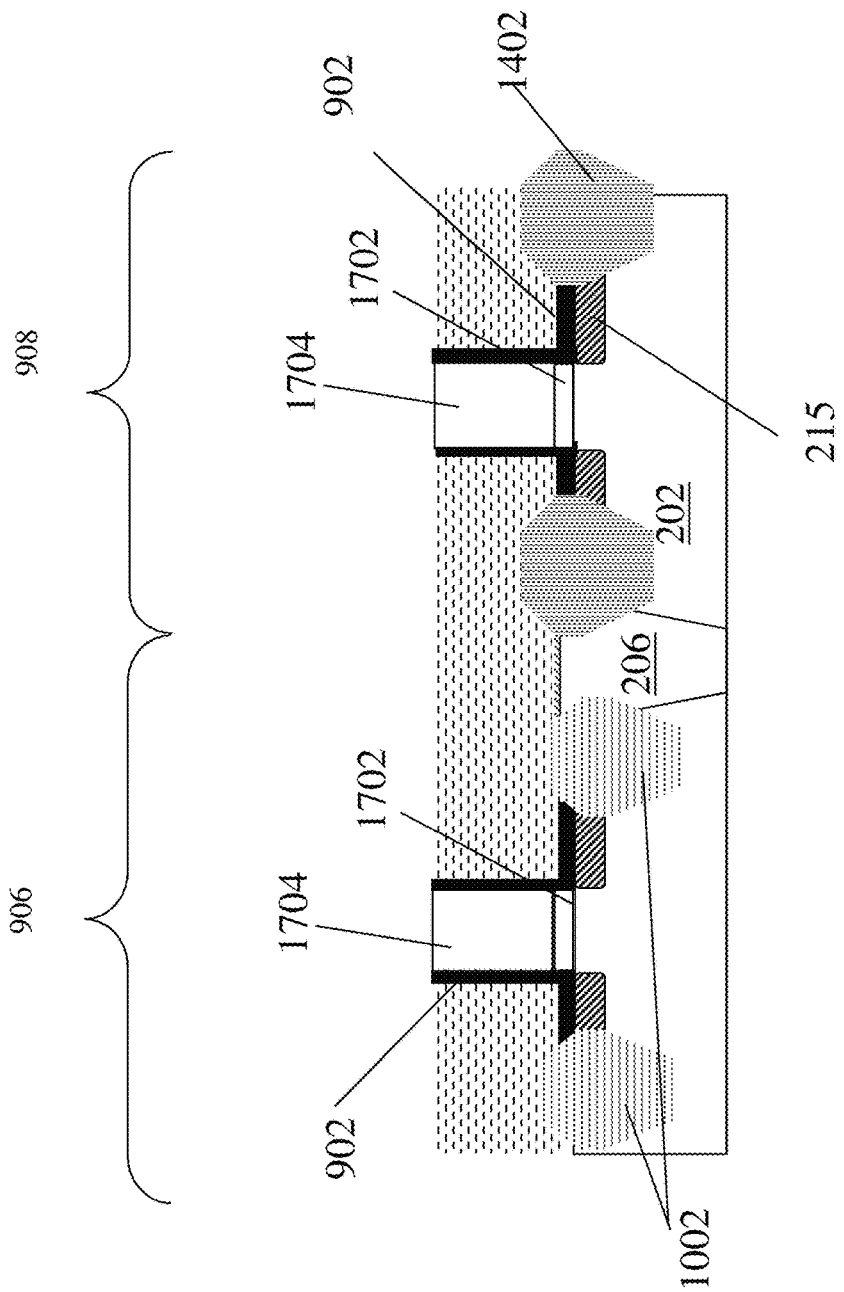

The method 800 then proceeds to block 830 where a gate is formed. The gate may be the operable gate(s) of the devices. In an embodiment, the gate includes a high-k dielectric and a metal gate electrode. Referring to the example of FIG. 17, a gate dielectric 1702 and gate electrode 1704 are formed in the trench 1602 (see FIG. 16). The gate dielectric 1702 in region 906 may be the same as or different than (e.g., composition) the gate dielectric 1702 in region 908. The gate electrode 1704 in region 906 may be the same as or different than the gate electrode 1704 in region 908.

The gate dielectric layer 1702 may include a dielectric material such as, silicon oxide, silicon nitride, silicon oxynitride, dielectric with a high dielectric constant (high k), and/or combinations thereof. Examples of high k materials include hafnium silicate, hafnium oxide, zirconium oxide, aluminum oxide, hafnium dioxide-alumina ($HfO_2$—$Al_2O_3$) alloy, or combinations thereof. The gate dielectric layer 1702 may be formed using conventional processes such as, photolithography, oxidation, deposition, etching, and/or a variety of other processes known in the art. The gate electrode layer 1704 may be formed by suitable methods such as, physical vapor deposition (PVD) (sputtering), chemical vapor deposition (CVD), plasma-enhanced chemical vapor deposition (PECVD), atmospheric pressure chemical vapor deposition (APCVD), low-pressure CVD (LP-CVD), high density plasma CVD (HDPCVD), atomic layer CVD (ALCVD), and/or other processes known in the art followed by a photolithography and etching processes. In embodiments, the gate electrode 1704 includes a metal composition such as, Cu, W, Ti, Ta, TiN, TaN, NiSi, CoSi, combinations thereof, and/or other suitable materials.

Thus, described herein are aspects of an embodiment of a method which includes providing a substrate and forming a first spacer material layer abutting a gate structure on the substrate. A second spacer material layer is formed adjacent and abutting the gate structure and overlying the first spacer. The first spacer material layer and the second spacer material layer are then etched concurrently to form a first spacer and a second spacer, respectively. An epitaxy region is formed (e.g., grown) on the substrate which includes an interface with each of the first and second spacers. The first spacer may be a liner layer.

In some embodiments, the method further includes forming a low-dose drain region prior to forming the first spacer. In some embodiments, the method further includes removing the second spacer after forming the epitaxy region. An interlayer dielectric (ILD) layer may be formed on the substrate after removing the second spacer; the ILD layer may include an interface with the first spacer.

In an embodiment, the first spacer material layer includes SiCN. In another embodiment, SiC. In an embodiment, the second spacer material layer includes silicon nitride. The etching the first and the second spacer material layer concurrently may include removing the first spacer material layer from a top surface of the gate structure and exposing a region of the substrate where the epitaxy region will be formed.

In some embodiments, forming the first spacer material layer includes forming a conformal layer, which is not etched prior to depositing material to form the second spacer.

In another embodiment, a method is described which includes providing a semiconductor substrate and forming a dummy gate structure on the semiconductor substrate. A spacer element liner layer is formed on the sidewalls of the dummy gate structure. Thereafter, a second spacer is formed abutting the spacer element liner layer. An epitaxy region is then grown on the semiconductor substrate adjunct the spacer element liner layer and the second spacer.

In some embodiments, growing the epitaxy region creates an interface between the epitaxy region and the liner layer. Forming the liner layer may include forming a layer of substantially uniform thickness. In some embodiments, the liner layer is not etched prior to the forming the second spacer. In an embodiment, the dummy gate structure is removed to provide a trench and a metal gate is formed in the trench.

Also described herein is an embodiment of a device, which includes a semiconductor substrate, a gate structure on the semiconductor substrate, and an epitaxy region disposed on the semiconductor substrate and adjacent the gate structure. The device further includes a spacer element abutting the gate structure and having at least one interface with the epitaxy region. An interlayer dielectric layer is disposed on the substrate and overlying the spacer element. In one embodiment of the device, the spacer element is SiCN.

What is claimed is:

1. A method comprising:
forming a gate structure over a substrate;
forming lightly doped source and drain (LDD) regions in the substrate, wherein the gate structure is disposed between the LDD regions;
after forming the LDD regions, forming a conformal first spacer material layer by depositing SiCN abutting a top surface and sidewalls of the gate structure on the substrate;
forming a conformal second spacer material layer overlying the first spacer material layer, wherein the conformal second spacer material layer overlies the top surface and sidewalls of the gate structure;
etching the conformal first spacer material layer and the conformal second spacer material layer concurrently to form a first spacer and a second spacer respectively, wherein the etching includes removing the first spacer material layer and the second spacer material layer from the top surface of the gate structure;

forming an epitaxy region on the substrate over the LDD regions, wherein the epitaxy region interfaces the first and second spacers;

after forming the epitaxy region, removing the second spacer to provide a space, wherein the space has a width defined by a first vertical sidewall of the epitaxy region and a vertical sidewall of the first spacer, the distance there between providing the width of the space;

using one deposition process, forming an interlayer dielectric layer (ILD) in the space; and forming a contact feature in the ILD layer and contacting the epitaxy region.

2. The method of claim 1, wherein the epitaxy region forms a raised source/drain region.

3. The method of claim 1, wherein the ILD layer includes an interface with the first spacer.

4. The method of claim 1, wherein the forming the second spacer material layer includes depositing silicon nitride.

5. The method of claim 1, wherein the etching the first spacer material layer and the second spacer material layer concurrently includes removing the first spacer material layer from a top surface of the gate structure and exposing a region of the substrate wherein the epitaxy region will be formed.

6. The method of claim 1, wherein the gate structure includes polysilicon.

7. The method of claim 6, wherein the gate structure includes a hard mask layer overlying the polysilicon.

8. The method of claim 1, wherein the forming the first spacer material layer includes forming a conformal layer, which is not etched prior to forming the second spacer material layer.

9. The method of claim 1, further comprising:

removing the gate structure from the substrate, wherein the removing the gate structure provides a trench having sidewalls defined by the first spacer material.

10. The method of claim 1, where the forming the contact feature in the ILD includes forming the contact feature in the ILD such that two opposing sidewalls of the contact feature interface the ILD.

11. The method of claim 1, wherein the forming the interlayer dielectric layer (ILD) in the space includes providing an interface between the ILD and the vertical sidewall of the first spacer, a lateral surface of the first spacer, the first vertical sidewall of the epitaxy region and a sidewall of the contact feature.

12. A method comprising:

forming a gate structure over a substrate;

forming lightly doped source and drain (LDD) regions in the substrate, wherein the gate structure is disposed between the LDD regions;

after forming the LDD regions, forming a first spacer material layer abutting the gate structure, wherein the first spacer material is SiCN;

forming a second spacer material layer overlying the first spacer material layer;

etching the first spacer material layer and the second spacer material layer to form a first and a second spacer respectively;

forming an epitaxy feature over the LDD regions in the substrate, wherein the epitaxy feature physically interfaces with the first and second spacers;

removing the second spacer after forming the epitaxy feature;

using a single deposition process, forming a dielectric layer including in a region between a vertical sidewall of the epitaxy feature and a vertical sidewall of the first spacer and also on the epitaxy feature; and forming a contact feature in the dielectric layer and on the epitaxy feature after removing the second spacer.

13. The method of claim 12, wherein the forming the epitaxy feature includes forming a raised source/drain of a transistor associated with the gate structure.

* * * * *